United States Patent [19]

Taylor

[11] Patent Number: 5,345,120

[45] Date of Patent: Sep. 6, 1994

[54] SWING LIMITING CIRCUIT FOR BICMOS SENSE AMPLIFIERS

[75] Inventor: Gregory F. Taylor, Portland, Oreg.

[73] Assignee: Intel Corporation, Santa Clara, Calif.

[21] Appl. No.: 7,253

[22] Filed: Jan. 21, 1993

[51] Int. Cl.$^5$ ............................................. G01R 19/00
[52] U.S. Cl. .................... 307/530; 307/495; 365/205; 365/208
[58] Field of Search ............... 307/495, 530, 542, 544, 307/564; 365/189.11, 189.04, 190, 208, 205, 225.6

[56] References Cited

U.S. PATENT DOCUMENTS 5,229,967  7/1993  Nogle et al. ..................... 307/495

Primary Examiner—James B. Mullins
Assistant Examiner—Jim Dudek
Attorney, Agent, or Firm—Blakely Sokoloff Taylor & Zafman

[57] ABSTRACT

A swing limiting circuit for limiting the voltage across the input of a BiCMOS sense amplifier includes first and second bipolar transistors each having their collectors coupled to a first supply potential and their emitters coupled to the respective bases of a pair of bipolar transistors forming the sense amplifier. First and second pass gate devices are utilized to couple the respected bases of the first and second transistors to the bit lines running through the memory so as to limit the voltage drop appearing across the bases of the first and second transistors. A pair of NMOS devices are configured as source followers in parallel with the bipolar transistors to keep the voltage at the bases of the differential pair from dropping below a predetermined level.

5 Claims, 1 Drawing Sheet

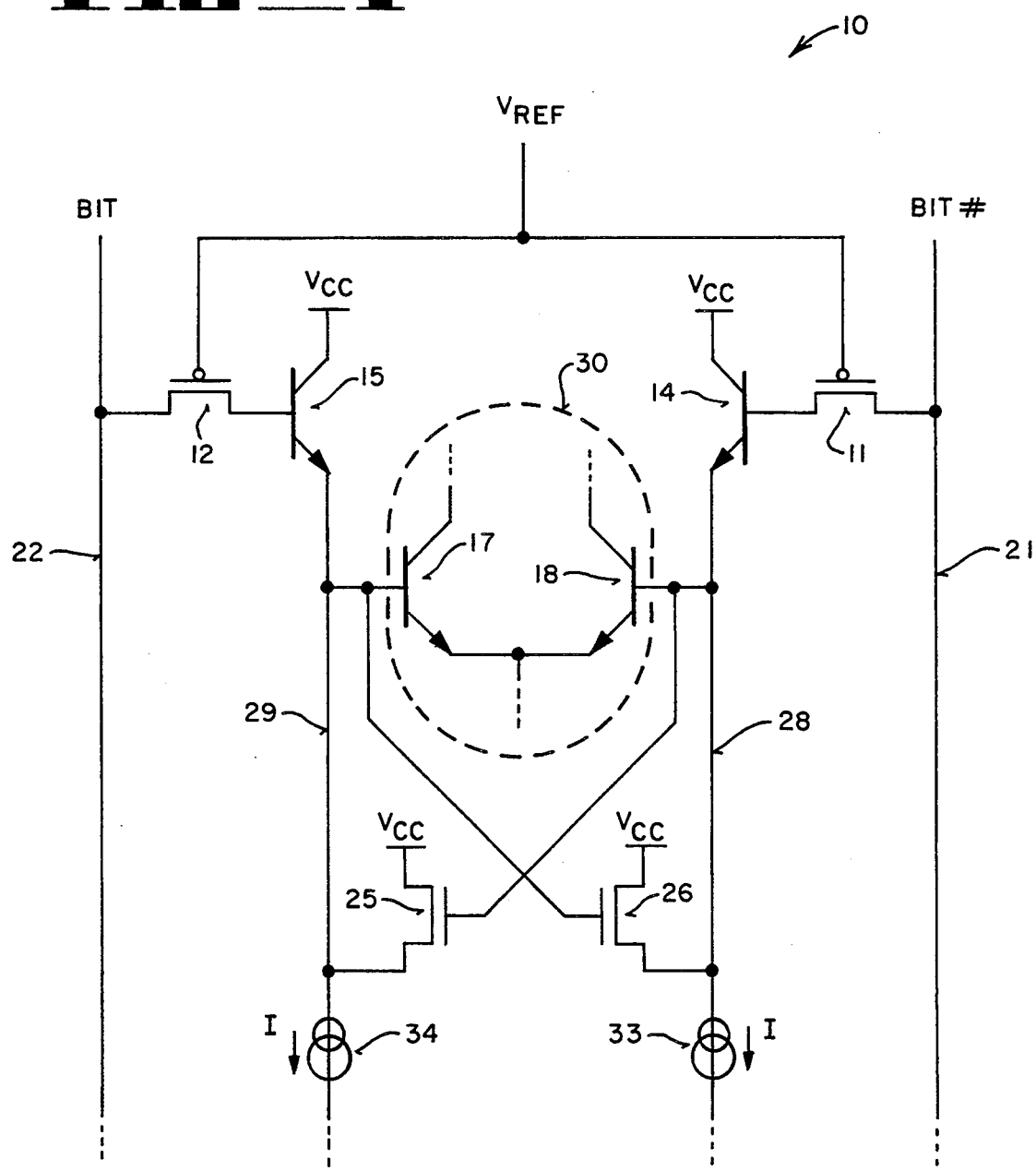

SWING LIMITING CIRCUIT FOR BICMOS SENSE AMPLIFIERS

FIELD OF THE INVENTION

The present invention relates to the field of integrated circuits; more particularly, to integrated circuits which incorporate both bipolar and complimentary MOS transistor technologies. More specifically, the present invention relates to sense amplifier circuitry used in semiconductor memories.

BACKGROUND OF THE INVENTION

In a typical semiconductor memory, individual memory cells are coupled to bit lines running across the length of the memory array. The bit lines themselves are often coupled through decoder circuitry which permits addressing and accessing of the information stored within the memory cells. The information which is stored within the memory cells is commonly sensed using a sense amplifier coupled to pairs of bit lines within the memory. Most often, the sense amplifier circuitry includes an ordinary differential amplifier which provides the output data and its compliment. By way of example, a conventional memory employing sense amplifier circuitry is described in U.S. Pat. No. 4,926,387.

In BiCMOS memory circuits one of the problems that can arise is that an excessive reverse voltage appears across the differential pair of bipolar transistors at the input of the sense amplifier. This high reverse voltage may result during either a read or write operation wherein one bit line is at the most positive supply potential ($V_{CC}$) and the complimentary bit line drops to the lowest supply potential ($V_{SS}$). Excessive reverse voltage across the bipolar devices in the sense amplifier can lead to hot electron damage in these devices.

Currently, the problem of excessive reverse voltage across the sense amplifier input is commonly dealt with in one of two ways. In a first technique, the bit line is clamped with a diode, thereby preventing it from dropping too far below the positive supply potential. This solution has the disadvantage of drawing large currents through the RAM bit cell during the entire time that it is enabled. Thus, the diode clamp solution both increases power dissipation as well as hot electron damage.

An alternative approach adds a complex controller circuit designed to disable the RAM cell when it has generated enough voltage swing so that the sense amplifier is able to detect the state of the memory cell. The controller circuitry, however, must be sensitive enough so as not to damage the sense amplifier itself during the disabling process. In either case, the bit lines must be disconnected from the sense amplifier for write operations. In other words, the alternative approach of using a controller circuit to disable the RAM cell is both complex and incomplete.

As will be seen, the present invention provides a circuit which limits the swing appearing across the inputs of a sense amplifier without incurring a substantial delay or power penalty. The invention provides a simple and elegant solution to the problem of excessive reverse voltage and accommodates both read and write operations.

SUMMARY OF THE INVENTION

The present invention comprises a swing limiting circuit for limiting the voltage across the input of a BiCMOS sense amplifier. The swing limiting circuit comprises first and second bipolar transistors each having their collectors coupled to a first supply potential and their emitters coupled to the respective bases of a pair of bipolar transistors forming the sense amplifier. The emitters of the first and second bipolar transistors are also coupled to respective current sources which provide a constant current through the first and second bipolar transistors. First and second pass gate devices are utilized to couple the respected bases of the first and second transistors to the bit lines running through the memory. The pass gate devices comprise PMOS transistors which have their gate commonly coupled to a reference potential so as to limit the voltage drop appearing across the bases of the first and second transistors.

The invention further comprises a pair of NMOS devices configured as source followers in parallel with the emitter follower first and second bipolar transistors. The NMOS source followers limit the swing appearing across the differential pair of the sense amplifier so as to keep the voltage at the bases of the differential pair from dropping below a predetermined level.

BRIEF DESCRIPTION OF THE DRAWINGS

FIG. 1 is a circuit schematic diagram of the swing limiting circuit of the present invention.

DETAILED DESCRIPTION OF THE DRAWINGS

A circuit for limiting the swing that appears across the inputs of a sense amplifier is described. In the following description, numerous specific details are set forth, such as specific voltage levels, currents, etc., in order to provide a thorough understanding of the present invention. It will be obvious, however, to one of ordinary skill in the art that the present invention may be practiced without these specific details. In other instances, well-known circuits have not been shown in order to avoid obscuring the present invention in unnecessary detail.

The present invention is realized with ordinary BiCMOS semiconductor technology and may be fabricated with any one of a number of well-known processes used to fabricate BiCMOS devices. As is currently implemented, the present invention is incorporated within a random-access memory (RAM) in which the entire memory as well as the sense amplifier and swing limiting circuitry is fabricated as an integrated circuit on the same substrate or die. This has an advantage in that process variations do not vary substantially over a single die. Hence, the characteristics of the devices in the circuit will be known relative to the characteristics of other devices within the memory for given die.

FIG. 1 illustrates the swing limiting circuit of the present invention in which bit lines 21 and 22 are shown being coupled to the bases of bipolar devices 14 and 15, through PMOS field effect devices 11 and 12, respectively. As is known within the field of random-access memories, bit line 21 (labeled BIT#) is the compliment of bit line 22 (labeled BIT). Bit lines 21 and 22 are used to address or access information stored within the individual cells of the memory.

The bit lines are also coupled to sense amplifier 30 used to read data stored within the memory cells. In FIG. 1, for example, the input portion of sense amplifier 30 is shown as comprising a differential pair of bipolar transistors 17 and 18. The base of transistor 17 is coupled to bit line 22 through bipolar transistor 15 and PMOS device 12. Similarly, bipolar transistor 18 is coupled to bit line 21 through bipolar transistor 14 and PMOS device 11.

Bipolar transistors 14 and 15 are configured as emitter followers with their emitters being coupled to current sources 33 and 34 along lines 28 and 29, respectively. Basically, current sources 33 and 34 provide a constant current through the emitter follower devices which act as level shifters.

PMOS devices 11 and 12 are both shown having their gates coupled to a reference potential which, in the currently preferred embodiment is approximately equal to $V_{cc}$ minus three volts. The purpose of the PMOS pass devices 11 and 12 is to limit how far negative the base of transistors 14 and 15 can fall; this limits the possibility of destructive reverse bias on the emitter follower devices. For example, if the voltage on bit line 21 dropped below the gate to source voltage plus the threshold of device 11, then PMOS device 11 would turn off. It should be understood that the reference potential Vref is basically determined by considerations of the allowable reverse bias voltage which can be tolerated at the bases of the emitter follower devices.

The circuit of FIG. 1 also includes NMOS field effect devices 25 and 26. NMOS device 25 is shown having its gate coupled to the emitter of bipolar transistor 14 (also connected to line 28 and the base of transistor 18), its drain coupled to $V_{cc}$ and its source coupled to line 29. Likewise, NMOS device 26 is shown having its gate coupled to the emitter of bipolar transistor 15 (also connected to the base of transistor 17 and line 29), its drain coupled to $V_{cc}$ and its source coupled to line 28. Thus, the n-channel devices 25 and 26 are shown configured as source followers. These source follower devices limit the swing appearing across the differential pair so as to avoid the problem of excessive reverse bias.

To better understand the present invention, consider the following example, assume that a write operation is occurring. In this case, bit line 22 may, for example, be at the most positive supply potential, $V_{cc}$, whereas BIT# line 21 would be at the most negative supply potential, $V_{ss}$. Under these voltage conditions, PMOS device 12 would be turned on and device 11 turned off; also, NMOS device 26 would be turned on and NMOS device 25 would be turned off. Note that transistor 26 is a source follower: for it to be turned on, the gate to source voltage must be greater than the threshold voltage of the device. This means that the source node coupled to line 28 must be below the gate voltage for the device to be on. If bit line 22 is at $V_{cc}$ then the gate of device 26 is at a voltage of approximately $V_{cc} - V_{be}$. Assuming that $V_{be} \sim 0.7$ volts and a $V_{gs}$ for device 26 of approximately 1.5 volts, then the voltage appearing at the base of device 18 is kept from dropping any lower than $V_{cc} - 2.2$ volts. (It should be understood that the gate to source voltage $V_{gs}$ of devices 25 and 26 is established by the current provided by current sources 33 and 34. Normally, this current is in the range of 20 to 50 microamperes.)

One of the distinct advantages of the present invention is that at the time that the base voltage of the differential pair is being maintained at a predetermined potential, the bit lines are free to swing across the range of the full supply potential. That is, bit lines 21 and 22 are free to swing between $V_{cc}$ and $V_{ss}$.

Consider now the operation of the circuit of FIG. 1 during a read operation. At the beginning of a read operation, both bit lines 21 and 22 are at $V_{cc}$, both PMOS devices are on, and both NMOS devices are off. Next, one of the bit lines begins to slowly drop in potential such that one side of the sense amplifier stays fixed while the other side drops in voltage. When the base of one of the differential pair of transistors drops to approximately $V_{cc} - 1.3$ volts, the corresponding NMOS transistor begins to turn on. Once the NMOS device is completely turned on, the voltage at the base of the sense amplifier input is clamped at a non-destructive voltage level. Continuing with the example, once one of the bit lines has dropped all the way to $V_{ss}$, the condition of the circuit of FIG. 1 is exactly the same as that described for a write operation. In other words, one of the PMOS devices will be on, and the other off. At the same time, one of the other corresponding NMOS devices will be on and the other off.

It is appreciated that the initial slow change in voltage during a read operation shows up without degradation at the differential pair. This means that the presence of the invented swing limiting circuitry does nothing to inhibit or slow the read or write operations. During a read operation, the circuitry behaves as if it was not even included in the amplifier circuitry—its only function being to limit the voltage at the input of the sense amplifier to avoid destructive reverse bias.

Whereas many alternations and modifications to the present invention will no doubt become apparent to the person of ordinary skill in the art after having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

I claim:

1. A circuit for limiting the voltage swing appearing across the inputs of a BiCMOS sense amplifier, said sense amplifier including a pair of emitter coupled bipolar transistors coupled to respective bit lines of a memory, said circuit comprising:

first and second bipolar transistors each having their collectors coupled to a first supply potential, and their emitters coupled to the respective bases of said pair of bipolar transistors and also to respective current sources;

a first PMOS device coupling the base of said first bipolar transistor to one of said bit lines;

a second PMOS device coupling the base of said second bipolar transistor to the other of said bit lines, the gates of said first and second PMOS devices being coupled to a reference potential below said first supply potential so as to limit the voltage drop at the bases of said first and second bipolar transistors;

a first NMOS device having its drain coupled to said first supply potential, its source coupled to the emitter of said first bipolar transistor, and its gate coupled to the emitter of said second bipolar transistor;

a second NMOS device having its drain coupled to said first supply potential, its source coupled to the emitter of said second bipolar transistor, and its gate coupled to the emitter of said first bipolar transistor;

said first and second NMOS devices being configured as source followers so as to keep the voltage at the bases of said pair of bipolar transistors from dropping below a predetermined potential.

2. The circuit of claim 1 wherein said first supply potential is the most positive potential coupled to said circuit.

3. The circuit of claim 1 wherein said reference potential is approximately equal to said first supply potential minus 3 volts.

4. The circuit of claim 1 wherein said current sources match each other.

5. The circuit of claim 1 wherein said predetermined potential is approximately equal to said first supply potential minus 2.2 volts.

* * * * *